Feb. 25, 1969 R. A. HILBOURNE 3,430,112

INSULATED GATE FIELD EFFECT TRANSISTOR WITH CHANNEL PORTIONS OF DIFFERENT CONDUCTIVITY

Filed July 13, 1965

INVENTOR
ROBERT A. HILBOURNE
BY Frank R Trifari

INVENTOR.
ROBERT A. HILBOURNE
BY Frank R. Trifari
AGENT

INVENTOR.
ROBERT A. HILBOURNE
BY Frank R. Trifari
AGENT

United States Patent Office 3,430,112

Patented Feb. 25, 1969

3,430,112

INSULATED GATE FIELD EFFECT TRANSISTOR WITH CHANNEL PORTIONS OF DIFFERENT CONDUCTIVITY

Robert Arthur Hilbourne, Harrow, England, assignor to North American Philips Company, Inc., New York, N.Y., a corporation of Delaware Filed July 13, 1965, Ser. No. 471,614
Claims priority, application Great Britain, July 13, 1964, 28,757/64
U.S. Cl. 317—235 5 Claims
Int. Cl. H01l 11/00, 15/00

ABSTRACT OF THE DISCLOSURE

An insulated gate field effect transistor having a first channel portion extending from source to drain of one surface resistivity and at least one other channel portion of different surface resistivity. The transistor will exhibit a resultant $g_m$-$Vg$ characteristic which can be tailored as desired, for example, to produce a remote cut-off characteristic.

This invention relates to semiconductor devices referred to as insulated gate field effect transistors, which have a surface channel controlled current flow.

The basic structure of such a device consists of a semiconductor body of high bulk resistivity having two surface regions of low resistivity spaced in the semiconductor body and forming two rectifying junctions with the bulk region of the body. A dielectric layer is formed on the surface of the body between the two low resistivity surface regions, for example, by oxidation of the semiconductor surface and a metallic layer is provided on the dielectric coating. When the dielectric layer is produced by oxidation of the semiconductor surface, the device is referred to as a metal-oxide-semiconductor transistor or MOST. A voltage applied between the two surface regions biases one junction in the forward direction and the other junction in the reverse direction. The current flow between the two surface regions may be controlled by the voltage applied to the metallic layer usually termed the control or gate electrode.

The device may be operated as a vacuum triode analogue because the flow of current between the two surface regions may be modulated by a signal applied to the control electrode; thus the device may be used, for example, in amplifier and oscillator circuits.

A simple vacuum tube triode is cut-off at a certain negative grid voltage and a negligible signal given across the anode load, even though the $g_m$-$Vg$ characteristic approaches the $Vg$ axis asymptotically. Because large signals on the grid drive the tube past cut-off it was found necessary to devise a tube which had a larger curved section in the characteristic. In practice this characteristic was obtained by varying the pitch of the control grid. With this tube a large signal on the grid does not drive the tube past cut-off but gives a small signal on the anode. This tube improved the selectivity of the first amplifying stage in a superheterodyne receiver and can also be used in an automatic gain control circuit.

Figure 1:
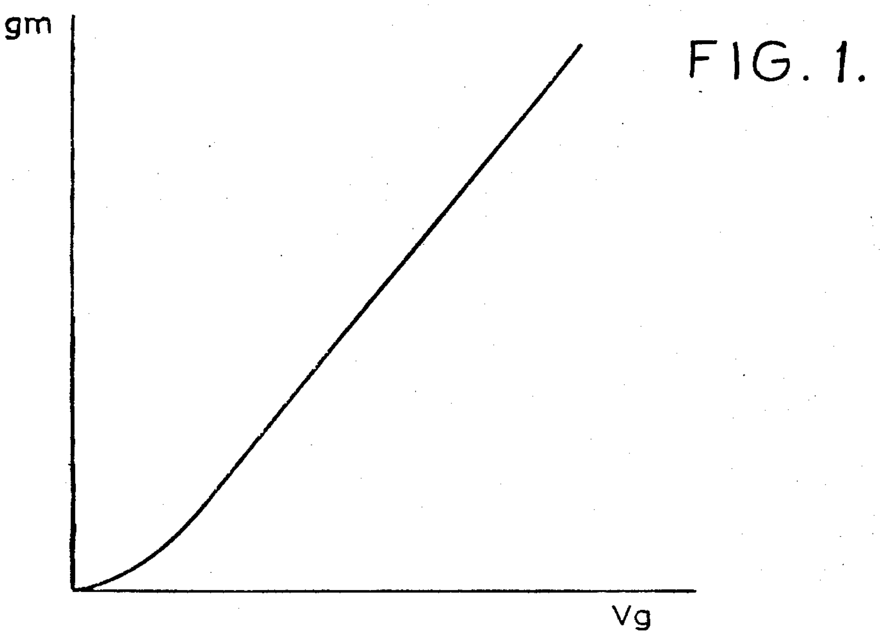

The normal $g_m$-$Vg$ characteristic of an $N^+$ $PN^+$ metal-oxide-semiconductor transistor is shown in FIGURE 1, wherein $Vg$ is the voltage applied to the control electrode and $g_m$ is the mutual conductance. The slope of the linear portion of the characteristic is given by the function:

$$\frac{g_m}{Vg}=\mu_n C\frac{b}{a}$$

where $\mu_n$ is the electron mobility in the semiconductor
$c$ is the capacitance of the control electrode per unit area $b$ is the length of the control electrode
$a$ is the width of the control electrode The slope of the characteristic shown in FIGURE 1 can be varied to a required value by selecting the values of $c$, $b$ and $a$.

Figure 2:
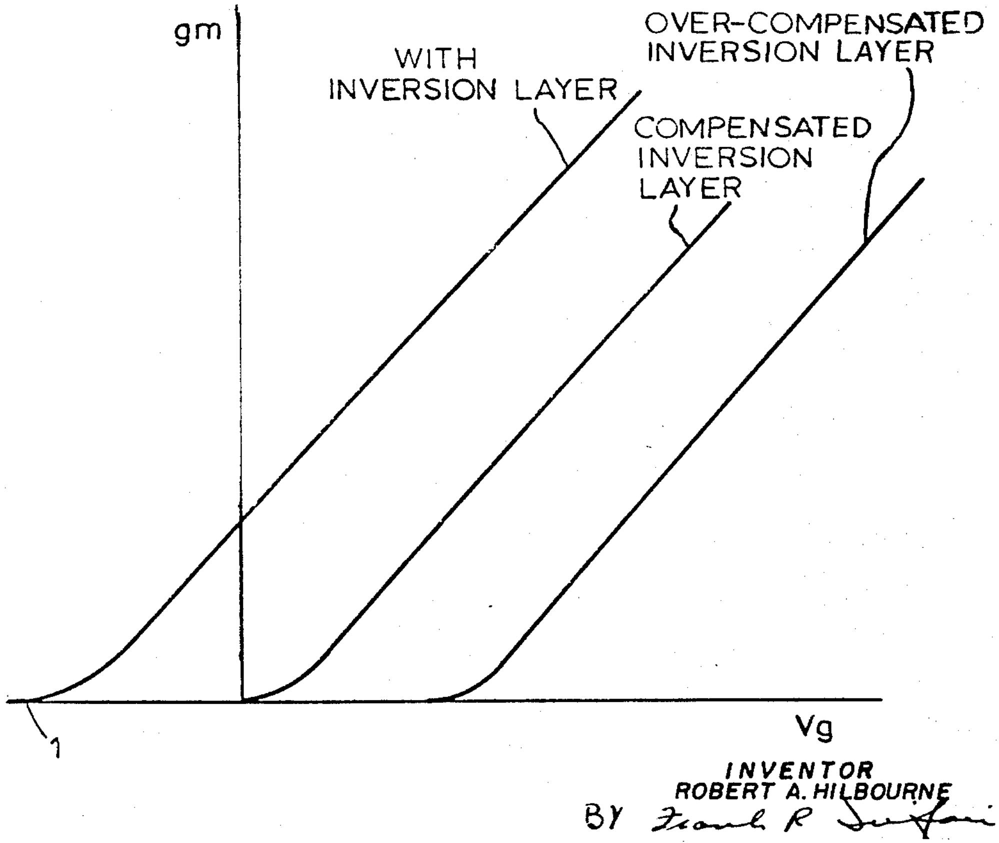

The point where the curve meets the $Vg$-axis is determined by the concentration of impurities under the control electrode. Characteristics of three devices with similar control electrode geometry and different surface doping are shown in FIGURE 2, the device having an $N^+$ $PN^+$ configuration. When the oxide layer is formed on the high resistivity P-type semiconductor surface an N-type channel which may be referred to as an inversion layer can be formed on the P-type surface. In order to bring the mobile charge concentration to approximately zero in the channel a negative potential must be applied to the control electrode, the curve will then meet the $Vg$ axis at point 1 at this control voltage.

The inversion layer may be compensated by doping with boron during the formation of the oxide layer and then the curve will cut the $Vg$-axis near the origin. The inversion layer may also be over-compensated by the diffusion of boron when a definite positive control voltage must be applied before the N-type conducting channel is formed and current flows.

According to the invention, in an insulated gate field effect transistor, the surface channel area consists of a plurality of areas having different surface resistivities. The areas having different surface resistivities may extend to the two surface regions. The semiconductor body of the insulated gate field effect transistor may be of silicon and the dielectric may be formed by oxidation of the silicon.

The invention also resides in an arrangement of a plurality of insulated gate field effect transistors electrically mounted in parallel with means to apply the same control voltage to each control electrode.

If, for example, three devices having different cut-off voltages because of different doping characteristics of the surface portion are mounted in parallel the combined $g_m$-$Vg$ characteristic will have a curve which is the sum of the individual curves. It is preferable if the individual curve with the most negative cut-off voltage has the smallest gradient and the curve with the highest positive cut-off voltage has the largest gradient. These requirements apply to the $N^+$ $PN^+$ configuration. The device may also be prepared with $P^+$ $NP^+$ configuration.

Figure 3:
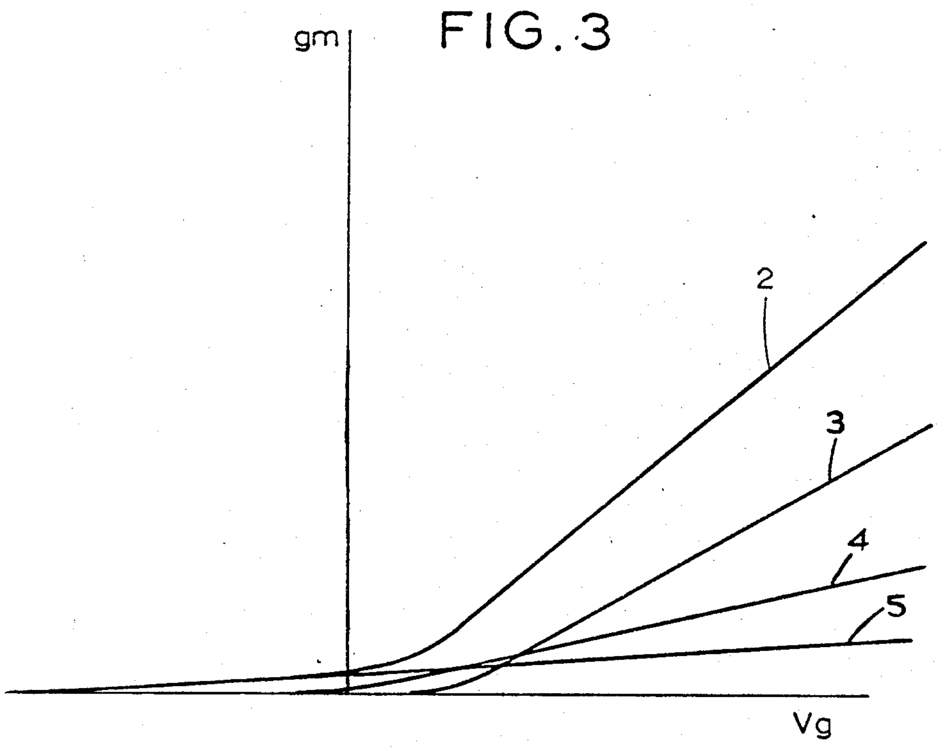

FIGURE 3 shows a combined characteristic 2 obtained from three devices having characteristics 3, 4 and 5 mounted in parallel. A single device having a characteristic similar to the combined characteristic shown in FIG. 3 may be obtained by variation of the surface properties of the semiconductor body under the dielectric layer. It will be realised that the invention is not limited to a single device which may be regarded as a combination of three devices having individual characteristics but also relates to an arrangement of a plurality of insulated gate field effect transistors electrically mounted in parallel with means to apply the same control voltage to each control electrode.

Figure 4:
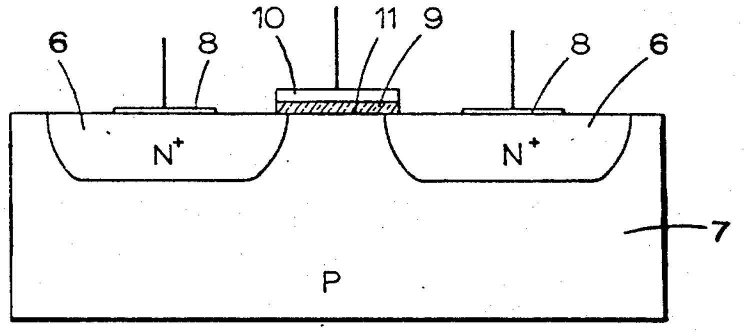

FIGURE 4 shows a vertical section through an insulated gate field effect device having linear geometry. Two low resistivity $N^+$ surface regions 6 are formed by diffusion techniques in a high resistivity P-type semiconductor monocrystalline body 7. A dielectric layer 9 is formed on the surface channel area 11, which is the area of the surface between the two low resistivity regions, and a metallic layer is deposited on the dielectric layer to form the control electrode 10. Ohmic contacts 8 are made to the two $N^+$ regions and electrical connection is made to the control electrode. The surface of the semiconductor body under the control electrode and not over the $N^+$ surface regions can be referred to as the "surface channel area" because it is under this area that the conducting surface channel is formed.

Figure 7:
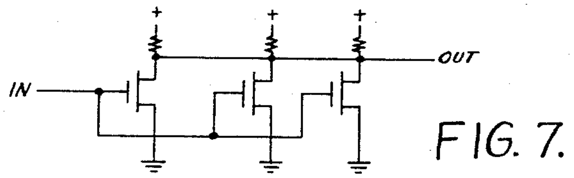
Figure 5:
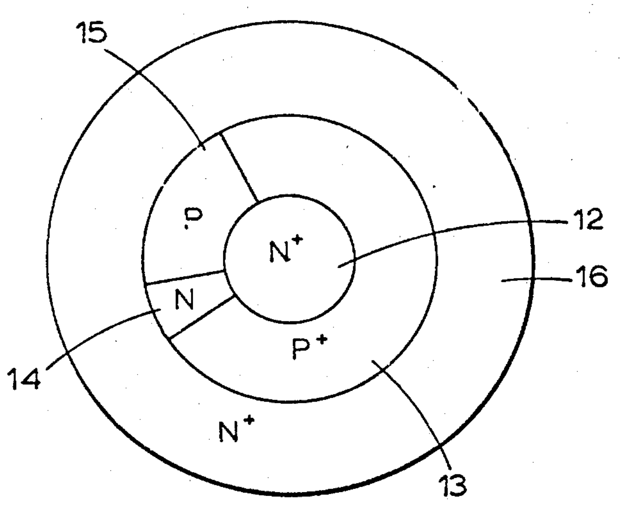
Figure 6:
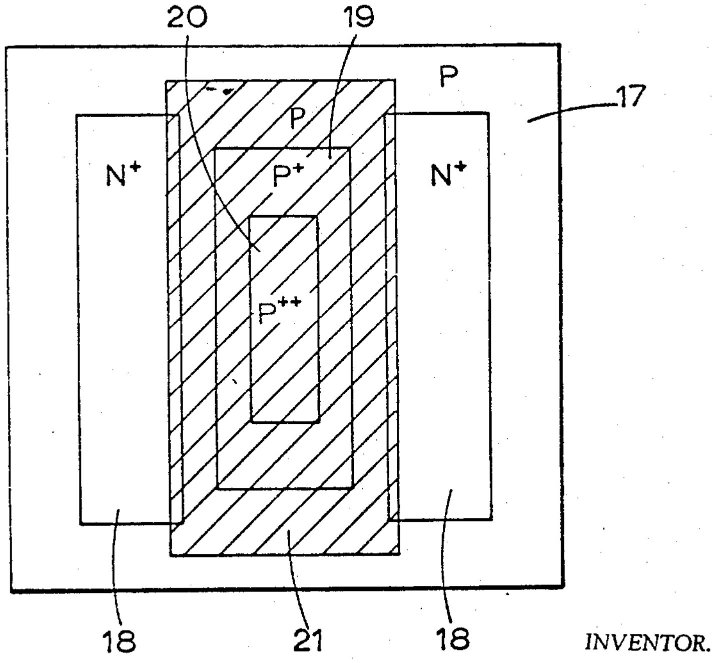

Three embodiments of devices according to the invention having the required characteristics will now be described with reference to:

FIGURE 5, which is a plan view of a $N^+ PN^+$ metal-oxide-semiconductor transistor having circular geometry, and FIGURE 6, which is a plan view of the surface of a metal-oxide-semiconductor transistor with linear geometry in which the areas of different resistivity are between the low resistivity surface regions but do not all extend thereto, and FIG. 7, which shows three insulated gate field effect transistors arranged in parallel.

Referring to FIGURE 5, a substrate of P-type boron-doped silicon having a resistivity of 12 ohm-cm. was uniformly oxidised by heating in wet nitrogen to a temperature of 1200° C. for 30 min., this formed an oxide layer approximately $0.6\mu$ thick. The formation of this oxide layer gave a thin N-type inversion layer at the surface of the substrate. A window corresponding to area 13 in FIGURE 5 was cut in the oxide layer using photoresist techniques and boron diffused into the substrate. The window was then extended to cover area 15 and boron was diffused into the substrate again in an amount sufficient to approximately compensate the N-type inversion layer existing in area 15. The oxide layer was then also removed from area 14 and oxide regrown over areas 13, 14 and 15 to provide a constant thickness of dielectric under the control electrode.

Windows were then opened over areas 12 and 16 and phosphorus diffused into the substrate to provide $N^+$ regions in the body of the semiconductor, the $N^+$ regions extending under the oxide layer over areas 13, 14 and 15. Ohmic contacts were then made to $N^+$ regions 12 and 16 and the control electrode formed by evaporating aluminum through a mask and heating to alloy the aluminum into regions 12 and 16. The areas to which different diffusion programs have been applied will have different surface resistivities.

Referring to the equation previously mentioned:

$$\frac{g_m}{Vg}=\mu_n C\frac{b}{a}$$

$\mu_n$, $c$ and $a$ are constant in the device described above and thus the slopes of the chartcteristics are dependent only on $b$. $a$ is $20\mu$ and the diameter of the outer edge of the control electrode is $400\mu$. The area 13 has been given a greater length than area 15 which has a greater length than area 14. Thus the slope of the characteristic derived from area 13 would be higher than the slopes of the characteristics obtained from areas 15 and 14. Because of the different surface characteristics of the substrate under areas 13, 14 and 15 the cut-off voltages of the areas are different. Area 13 has a higher positive voltage applied to the control electrode at the cut-off point than does area 15, which has a more positive-cut-off voltage than does area 14.

Referring to FIGURE 3, area 13 would have a characteristic similar to that indicated as curve 3, area 15 would have a characteristic similar to that indicated as curve 4 and area 14 would have a characteristic similar to that indicated by curve 5. The characteristic of the complete device would be similar to curve 2. If a very high negative potential is applied to the control electrode the device is cut-off and negligible current flow occurs.

The voltage applied to the control electrode is made less negative and at a certain voltage the surface of the substrate under area 14 will begin to conduct between the two $N^+$ regions. As the voltage applied to the control electrode is made more positive the substrate surface under areas 15 and 13 conducts.

In another embodiment the areas of different resistivity do not all extend to the surface regions of low resistivity, this embodiment will now be described with reference to FIGURE 6. Two $N^+$ surface regions 18 were formed by diffusion of phosphorus into a masked P-type silicon body 17. Using photoresist techniques boron was then diffused into the body 11 between the surface regions to form a $P^+$ region 19 and a $P^{++}$ region 20 within the $P^+$ region. A layer of silicon dioxide having uniform thickness was then formed over the area 21 (shown hatched) as the dielectric and a layer of aluminum deposited over the surface of the silicon dioxide to form the control electrode. Ohmic contacts were formed on the $N^+$ regions 18 by alloying aluminum into the regions and making electrical connections to the aluminum areas.

In operation this device gives a characteristic similar to that shown in FIGURE 3 but with the cut-off voltage having a definite positive value because the silicon surface in contact with the dielectric layer is P-type and thus a positive voltage must be applied to the control electrode in order to form an N-type surface channel between the $N^+$ surface regions. When the N-type surface channel is first formed it extends around the $P^+$ region 19. With increase in the positive voltage applied to the control electrode the N-type surface channel extends into the originally $P^+$ region 19 and then into the originally $P^{++}$ region 20. An N-type surface channel is then present in the silicon body under the whole area of the control electrode.

It will be realised that this embodiment may have the diffused regions 19, 20 of such a geometry and doping characteristics to give a required $g_m$-$Vg$ characteristic.

Both embodiments described have three areas of different surface resistivity under the control electrode; however the invention is not limited to such a number of areas. In the simplest device according to the invention two areas having different surface resistivities are formed.

FIG. 7 shows an arrangement of three insulated gate field effect transistors electrically mounted in parallel with means to apply the same control voltage to each gate electrode. In accordance with the invention, the surface properties of the semiconductor body underlying the gate electrode for each of the devices shown would be different to give a combined $g_m$-$Vg$ characteristic which is the sum of the individual curves.

What is claimed is:

1. A unipolar field-effect transistor of the insulated gate type, comprising a body portion of semiconductive material of one type conductivity having a major surface defining a surface portion of said body, spaced surface regions in said surface portion but of the opposite type conductivity and constituting source and drain electrodes of the transistor and defining between them adjacent the surface a channel region, an insulating layer on the surface over the channel region, and a gate electrode on the insulating layer and overlying the channel region, wherein one portion of said channel region extends between the source and drain adjacent the surface and underlying the gate and is of the opposite type conductivity, and another portion of the channel region adjacent the surface and underlying the gate electrode includes two surface layers of said one type conductivity but of different resistivity, whereby the transistor exhibits a different $g_m$-$V_{gate}$ characteristic compared with a similar transistor having a channel region of only one surface resistivity value.

2. A field-effect transistor as set forth in claim 1 wherein each of the channel portions of different surface resistivity extend to the source and drain electrodes whereby said channel portions are arranged in parallel between the source and drain electrodes.

3. A field-effect transistor as set forth in claim 2 wherein the channel portions include a first portion of said opposite type conducitivity, a second lightly-doped portion of said one type conductivity, and a third heavier-doped portion of said one type conductivity.

4. A field-effect transistor as set forth in claim 1 wherein said one portion of said channel region exhibits properties rendering it conductive between the source and drain electrodes at a value of gate voltage lower than the value required to render conductive the other portion of the channel region.

5. A unipolar field-effect transistor of the insulated gate type, comprising a body portion of semiconductive material of one type conductivity having a major surface defining a surface portion of said body, spaced surface regions in said surface portion but of the opposite type conductivity and constituting source and drain electrodes of the transistor and defining between them adjacent the surface a channel region, an insulating layer on the surface over the channel region, and a gate electrode on the insulating layer and overlying the channel region, wherein the channel region includes a first portion extending to and between the source and drain adjacent the surface and underlying the gate and having a first value of surface resistivity, a second portion within the first portion having a second value of resistivity, and a third portion within the second portion having a third value of resistivity, said first, second and third values of resistivity being different from one another, said second and third channel portions being adjacent the surface and underlying the gate electrode and being spaced from the source and drain electrodes, whereby the transistor exhibits a different $g_m$-$V_{gate}$ characteristic compared with a similar transistor having a channel region of only one surface resistivity value.

References Cited

UNITED STATES PATENTS

| | | | |
|---|---|---|---|
| 3,243,669 | 3/1966 | Sah | 317—235 |
| 3,283,221 | 11/1966 | Heiman | 317—235 |
| 3,271,201 | 9/1966 | Pomerantz | 317—234 |
| 3,374,407 | 3/1968 | Olmstead | 317—235 |

FOREIGN PATENTS

| | | |
|---|---|---|
| 912,114 | 12/1962 | Great Britain. |

OTHER REFERENCES

IBM Technical Disclosure Bulletin, "An And Gate Using Single FET" by Brennemann et al., vol. 7, No. 1, June 1964, p. 7.

Electronics, "The Future of Thin-film Active Devices," vol. 37, No. 4, Jan. 24, 1964, pp. 23–26.

JOHN W. HUCKERT, *Primary Examiner.*

JERRY D. CRAIG, *Assistant Examiner.*

U.S. Cl. X.R.

307—301